United States Patent
Hua et al.

(10) Patent No.: US 8,971,014 B2
(45) Date of Patent: Mar. 3, 2015

(54) PROTECTION STRUCTURE FOR METAL-OXIDE-METAL CAPACITOR

(75) Inventors: Wei-Chun Hua, Toufen Township (TW); Chung-Long Chang, Dou-Liu (TW); Chun-Hung Chen, Xinpu Township (TW); Chih-Ping Chao, Hsinchu (TW); Jye-Yen Cheng, Taichung (TW); Hua-Chou Tseng, Hsinchu (TW)

(73) Assignee: Taiwan Semiconductor Manufacturing Company, Ltd. (TW)

(*) Notice: Subject to any disclaimer, the term of this patent is extended or adjusted under 35 U.S.C. 154(b) by 183 days.

(21) Appl. No.: 12/984,731

(22) Filed: Jan. 5, 2011

(65) Prior Publication Data

US 2012/0092806 A1    Apr. 19, 2012

Related U.S. Application Data

(60) Provisional application No. 61/394,135, filed on Oct. 18, 2010.

(51) Int. Cl.
- *H01G 4/228* (2006.01)
- *H01L 49/02* (2006.01)
- *H01L 23/522* (2006.01)

(52) U.S. Cl.
CPC ............ *H01L 28/60* (2013.01); *H01L 23/5223* (2013.01)
USPC ........ 361/306.3; 361/304; 257/306; 257/211; 257/309; 257/532

(58) Field of Classification Search
USPC ............... 361/306.3, 304; 257/306, 211, 309, 257/532, 522, 307, 308, 534
See application file for complete search history.

(56) References Cited

U.S. PATENT DOCUMENTS

| | | | | |
|---|---|---|---|---|
| 5,583,359 | A * | 12/1996 | Ng et al. | 257/306 |
| 6,819,542 | B2 * | 11/2004 | Tsai et al. | 361/304 |
| 7,209,340 | B2 * | 4/2007 | Iioka et al. | 361/306.3 |
| 8,022,458 | B2 * | 9/2011 | Chang et al. | 257/307 |
| 2004/0174655 | A1 | 9/2004 | Tsai et al. | |
| 2010/0123214 | A1 * | 5/2010 | Chen et al. | 257/532 |

FOREIGN PATENT DOCUMENTS

CN          1885556          12/2006

\* cited by examiner

*Primary Examiner* — Robert J Hoffberg
*Assistant Examiner* — Hung Dang
(74) *Attorney, Agent, or Firm* — Lowe Hauptman & Ham, LLP

(57) ABSTRACT

A capacitor structure includes first and second sets of electrodes and a plurality of line plugs. The first set of electrodes has a first electrode and a second electrode formed in a first metallization layer among a plurality of metallization layers, wherein the first electrode and the second electrode are separated by an insulation material. The second set of electrodes has a third electrode and a fourth electrode formed in a second metallization layer among the plurality of metallization layers, wherein the third electrode and the fourth electrode are separated by the insulation material. The line plugs connect the second set of electrodes to the first set of electrodes.

20 Claims, 3 Drawing Sheets

PROTECTION STRUCTURE FOR METAL-OXIDE-METAL CAPACITOR

CROSS-REFERENCE TO RELATED APPLICATIONS

The present application claims priority of U.S. Provisional Patent Application Ser. No. 61/394,135, filed on Oct. 18, 2010, which is incorporated herein by reference in its entirety.

BACKGROUND

The disclosure relates generally to semiconductor devices, and more particularly, to protection structures for metal-oxide-metal (MOM) capacitors.

A seal ring including a combination of metal lines connected by via plugs is provided as a protection structure that protects a chip from environmental contaminants, such as moisture or micro-cracking during a semiconductor manufacturing process, such as a die saw process. The seal ring may be placed at the outer edges of the chip to ensure reliable performance of the enclosed integrated circuit and devices. Seal rings are also used to protect capacitors, which are widely used in integrated circuits.

One of the most commonly used capacitors is the metal-oxide-metal (MOM) capacitor. If the seal ring is placed a distance away from the MOM capacitor, the MOM capacitor may still suffer from reliability issues. One method to enhance the reliability of the seal ring is to place one or more seal rings closer to the MOM capacitor. However, the additional seal ring(s) will occupy additional chip area and the method might be less desirable for use in advanced chip designs.

BRIEF DESCRIPTION OF DRAWINGS

The features, aspects, and advantages of the disclosure will become more fully apparent from the following detailed description, appended claims, and accompanying drawings in which:

DETAILED DESCRIPTION

In the following description, numerous specific details are set forth to provide a thorough understanding of embodiments of the present disclosure. However, one having an ordinary skill in the art will recognize that embodiments of the disclosure can be practiced without these specific details. In some instances, well-known structures and processes have not been described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
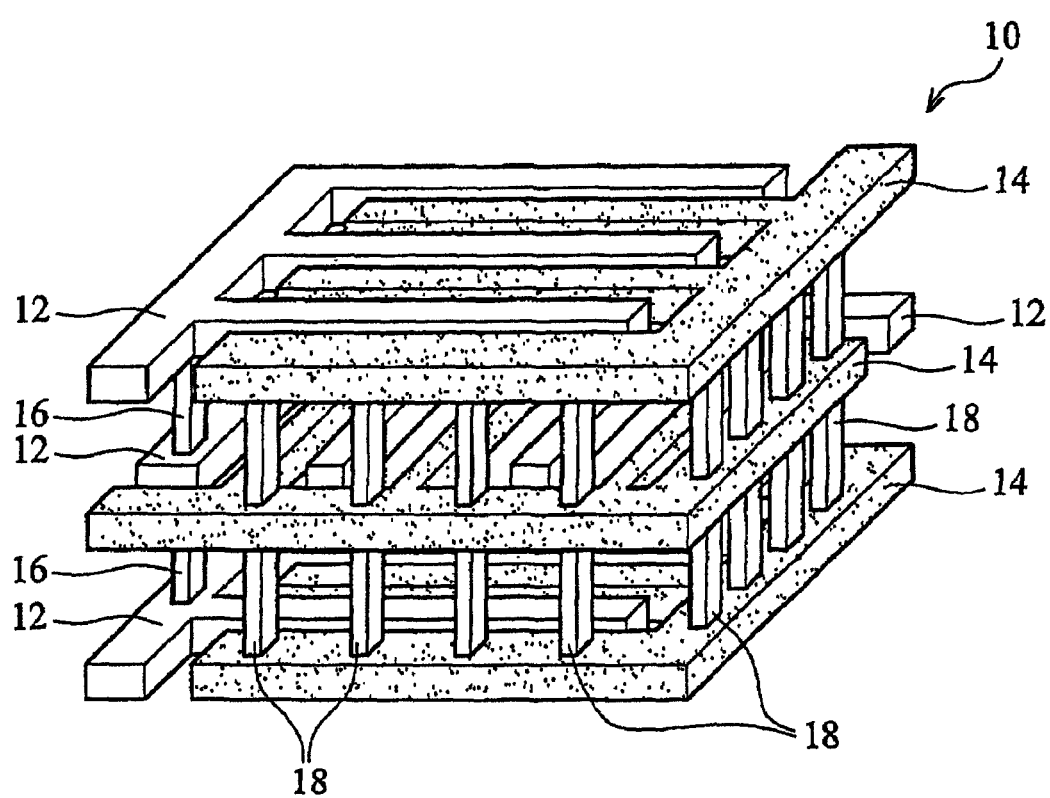
FIG. 1 is a perspective view of a multi-layer metal-oxide-metal capacitor.
Figure 2:
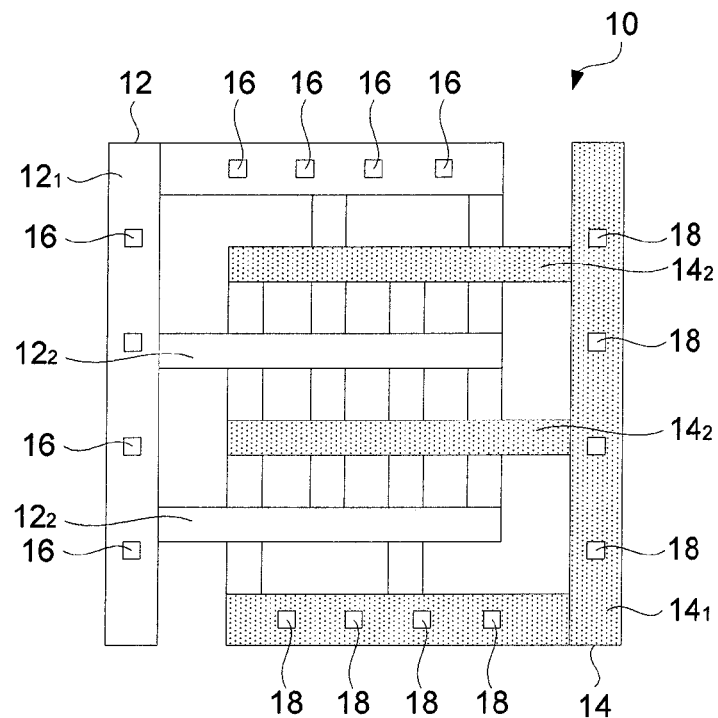
FIG. 2 is a top view of the multi-layer metal-oxide-metal capacitor shown in FIG. 1.

A MOM capacitor 10 is shown in FIGS. 1 and 2. FIG. 1 illustrates a perspective view of the capacitor 10, which includes two metal electrodes 12 and 14 separated by dielectric materials. Each of the metal electrodes 12 and 14 forms a three-dimensional structure. For clarity, metal electrode 12 is shown as unpatterned and metal electrode 14 is patterned with dots.

Each of the metal electrodes 12 and 14 includes more than one layer connected by via plugs, and each layer is formed in a metallization layer used for the formation of interconnect structures. FIG. 2 illustrates a top view of the MOM capacitor 10 shown in FIG. 1. Metal electrode 12 includes fingers $12_2$ and a bus $12_1$ that connects all the fingers $12_2$. Metal electrode 14 includes finger $14_2$ and a bus $14_1$ that connects all the fingers $14_2$. Fingers $12_2$ and $14_2$ are placed in an alternating pattern (interdigitating arrangement) with a very small space between the neighboring fingers. Therefore, each finger $12_2$/$14_2$ forms a sub capacitor(s) with its neighboring fingers $14_2$/$12_2$ or a bus $14_1$/$12_1$. The total capacitance of the MOM capacitor 10 is equivalent to the sum of the sub capacitors.

The direction of the fingers in the second metallization layer is orthogonal to the direction of fingers in the first metallization layer. Similarly, electrodes 12 and 14 in the second metallization layer include buses $12_1$ and $14_1$ and a plurality of fingers $12_2$ and $14_2$, respectively. Typically, buses $12_1$ in all the layers have similar shapes and sizes and are overlapped vertically. Buses $14_1$ in all the layers also have similar shapes and sizes and are overlapped vertically. Vias 16 connect buses $12_1$ in the first and second metallization layers, thereby forming an integral electrode 12. Similarly, vias 18 connect buses $14_1$ in neighboring layers, thereby forming an integral electrode 14.

Figure 3:
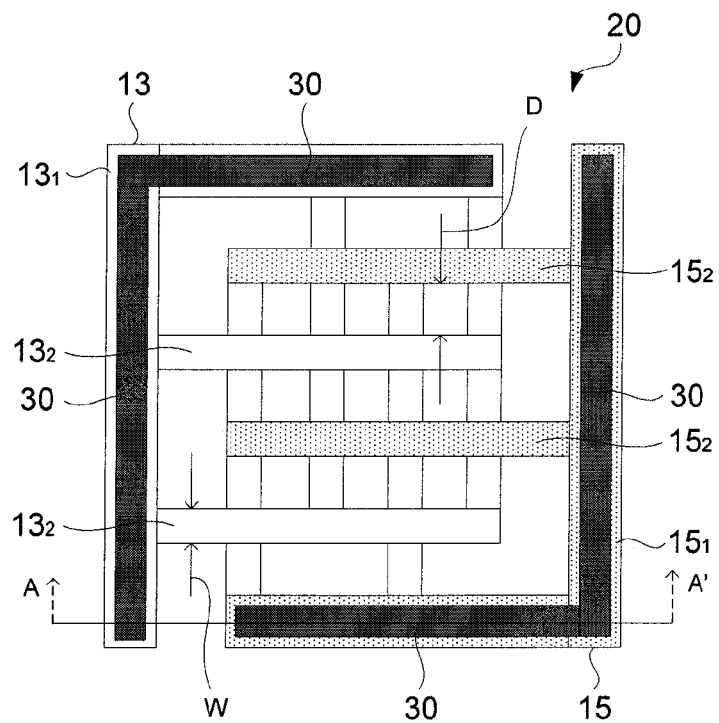
FIG. 3 is a top view of a capacitor structure, according to some embodiments.
Figure 4:
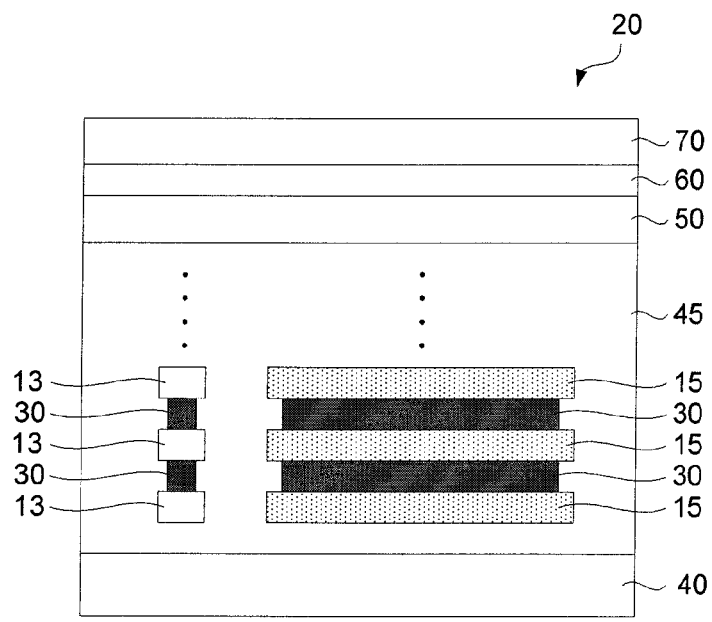
FIGS. 4 and 5 are cross-sectional views (at various manufacturing stages) of the capacitor structure shown in FIG. 3 taken along line A-A'.
Figure 5:
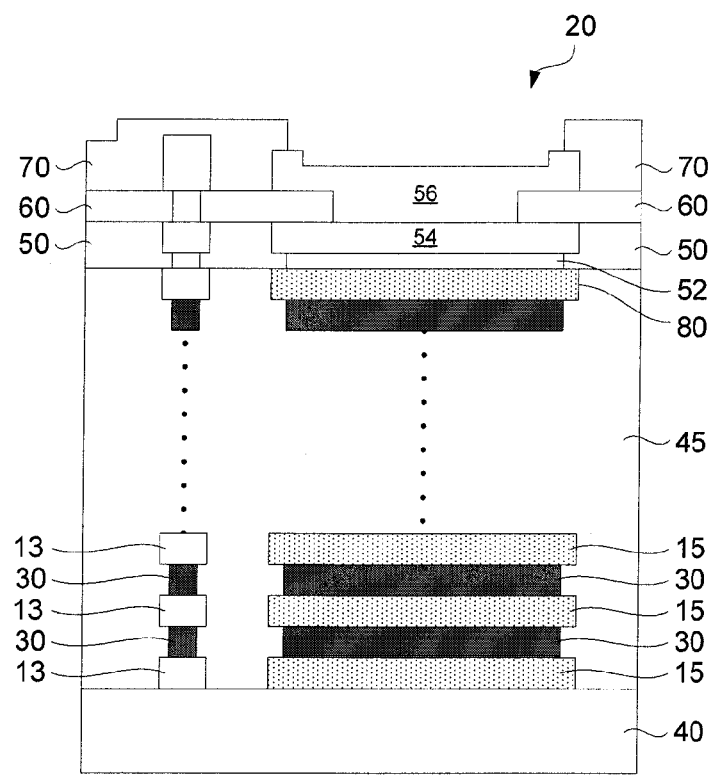

FIGS. 3, 4 and 5 depict a capacitor structure, according to some embodiments. FIG. 3 depicts a top view of a top layer (layer 1) of capacitor 20, which includes a first set of electrodes having two electrodes, also sometimes referred to as capacitor plates separated by dielectric materials. Shown in FIG. 3 are two electrodes 13 and 15, wherein the electrode 13 is illustrated with no pattern and no filling, and electrode 15 is patterned with dots, for clarity. Capacitor 20 preferably expands through multiple metallization layers, although it can be formed in only one layer. Accordingly, electrodes 13 and 15 are preferably formed in multiple layers. Electrodes 13 and 15 are shown as having symmetric features. Therefore, any described characteristics of electrode 13 apply to electrode 15, and vice-versa. In some other embodiments, electrodes 13 and 15 may have non-symmetric features. Those skilled in the art understand that a plurality of conductive materials may be used in the formation of the electrodes of a capacitor. Each electrode 13 and 15 may be comprised of a same or different conductive material such as copper, aluminum, titanium nitride clad titanium, doped polysilicon, or other conductive materials.

In layer 1, electrode 13 comprises a bus $13_1$ and fingers $13_2$ connected to bus $13_1$. Electrode 15 comprises a bus $15_1$ and fingers $15_2$ which are connected to bus $15_1$. In some embodiments, fingers $13_2$ and $15_2$ have a width W of about 50 nm to about 1000 nm. In other embodiments, fingers $13_2$ and $15_2$ have a width W of about 200 nm to about 1000 nm. In one embodiment, the distance D between the fingers is about 50 nm to about 1000 nm. In other embodiments, the distance D is about 200 nm to about 1000 nm. One skilled in the art will understand that the width W is related to the technologies used and will be reduced when the integrated circuits are scaled down.

Overlying or underlying layer 1, in a layer 2 is a second set of electrodes having two electrodes 13 and 15. For simplicity and ease of understanding, only the formation of layer 1 and layer 2 are shown. Similar to layer 1, electrode 13 in layer 2 includes a bus $13_1$ and fingers $13_2$. Also in layer 2, electrode 15 includes a bus $15_1$ and fingers $15_2$. Fingers $13_2$ and $15_2$ are parallel to each other and placed in an alternating pattern (interdigitating arrangement), so that each of the fingers $13_2$/$15_2$ forms a sub capacitor with the neighboring fingers $15_2$/$13_2$. As is known in the art, all these sub capacitors are connected in parallel, and the equivalent capacitance of the capacitor 20 is the sum of all sub-capacitances.

An insulation material (not shown) fills the vacancy between the neighboring fingers $13_2$ and $15_2$. Insulation material is preferably an inter-metal dielectric material that is used for the isolation of interconnect structures. Therefore, insulation material preferably has a low k value, although a high k value will help increase the capacitance. In one embodiment, the k value is less than 3.6. In some embodiments, the insulation material includes fluorine-doped oxide, carbon-doped silicon oxide, and other materials commonly used in the art. It is understood that the insulation material may change in composition, from stacked layer to stacked layer, depending on the process technology employed to construct the capacitor structure 20.

FIG. 3 also illustrates line plug schemes on the capacitor 20 for connecting electrodes on different metallization layers. One or more line plugs 30 are formed for connecting the second set of electrodes to the first set of electrodes. In one embodiment, a line plug 30 connects the electrode 13 in layer 1 to electrode 13 in layer 2 and a line plug 30 connects electrode 15 in layer 1 to electrode 15 in layer 2. Preferably, the bus $13_1$ in layer 2 and the bus $13_1$ in layer 1 have as much overlap as possible, and at least a portion of the bus $13_1$ overlaps the overlying and/or underlying bus $13_1$ so that line vias and hence line plugs 30 can be formed. Similar to electrode 13, the bus $15_1$ in layer 2 and the bus $15_1$ in layer 1 have at least one portion overlapping. Therefore, the line plugs 30 connect overlapping portions of buses $13_1$ in layers 1 and 2 and overlapping portions of buses $15_1$ in layers 1 and 2.

Line plugs 30 may be formed by standard metal photolithography, deposition, etching, and planarization processes. To form line plugs 30, a layer of dielectric layer (not shown in the top view) such as made from an insulation material is deposited above a set of electrodes 13,15 over a substrate. The dielectric layer, preferably having a low-k value, e.g., with a dielectric constant of 3 or less, may be an inter-layer dielectric or an inter-metal dielectric layer. The dielectric layer has a thickness of between about 50 nm and about 1000 nm, according to one embodiment. The dielectric layer is then patterned using a lithographic process and then etched using plasma etching, for example to form one or more openings, according to one embodiment. The openings are filled with a conductive material such as copper, copper alloy, aluminum, and aluminum alloy. Other conductive materials are also contemplated. A planarization step using a chemical mechanical polishing (CMP), for example is then performed to level the conductive material to form line plugs 30 in capacitor structure 20.

The line plugs (or line vias) 30, in some embodiments, extend continuously along a substantial length of the respective electrodes 13,15 as best seen in FIG. 3, and form a self seal-ring that enhances the capacitor's reliability, and obviates the need to place one or more additional seal rings around the MOM capacitor 20. As a result, no additional chip area is required for additional seal rings around the MOM capacitor 20.

FIGS. 4 and 5 are cross-sectional views of the capacitor 20 at intermediate stages in a manufacturing process in accordance with some embodiments. The cross-sectional views are taken from a plane crossing line A-A' (refer to FIG. 3). Line A-A' is selected so that adequate, but not overwhelming, details for understanding the formation processes are shown. Reference numerals used in FIG. 3 are also used in FIGS. 4 and 5 to identify like elements.

FIG. 4 depicts the capacitor structure 20 of FIG. 3 encapsulated by one or more passivation layers, the capacitor structure formed in an insulation material 45 above a substrate 40, according to one embodiment. The insulation material 45 may be formed of a dielectric such as silicon oxide based materials such as undoped silicate glass (USG), fluorinated silicate glass (FSG), PECVD silicon oxide, and oxide/nitride/oxide. In addition, the insulation material 45 may be formed of one or more high-k (high dielectric constant) materials, preferably having a dielectric constant of at least 8, such as $Ta_2O_5$, $HfO_2$, $SrTiO_3$, $PbTiO_3$, $KNO_3$, and $Al_2O_3$.

The capacitor structure is shown as having two electrodes 13 and 15 and for simplicity only three electrodes 13 and 15 are shown. The capacitor structure expands through multiple metallization layers and line plugs 30 connect electrodes on different metallization layers, according to one embodiment. To achieve higher capacitance, the electrodes may be stacked in a substantially vertical fashion in a plurality of layers interconnected with line plugs 30 between the electrode layers. It will be appreciated, however that there is no limit to the number of electrodes in a metallization level or the number of metallization levels that may be used to form a series of capacitors.

A USG layer 50 is formed over the top most electrode layer (not shown). First passivation layer 60 is then formed over USG layer 50 followed by a second passivation layer 70 formed over first passivation layer 60. In subsequent process steps, other overlying layers can further be formed over the substrate to finish the formation of the capacitor structure 20.

FIG. 5 depicts the capacitor structure 20 of FIG. 3 as having formed thereover a metal pad for electrical connection to a bump or wire. The capacitor structure is shown as having two electrodes 13 and 15. For simplicity, only three electrodes 13 and 15 and a top electrode 80 are shown. The capacitor structure 20 expands through multiple metallization layers and line plugs 30 connect electrodes on different metallization layers. Formed over top electrode 80 is a top via 52. A top metal layer 54 formed in a USG layer 50 electrically couples the top electrode 80 via the top via 52. A metal pad 56 (e.g. Al pad) is then formed over the top metal layer 54 in first and second passivation layers 60 and 70, respectively.

Embodiments of the MOM capacitor disclosed herein provide several advantages, including enhanced reliability, obviating the need to place one or more seal rings closer to the MOM capacitor, thereby occupying less area when compared to traditional seal ring capacitor schemes.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A capacitor structure, comprising:
a first set of electrodes having a first electrode and a second electrode formed in a first metallization layer among a plurality of metallization layers, wherein the first electrode and the second electrode are separated by an insulation material, the first electrode includes first fingers extending in a first direction, and the second electrode includes second fingers extending in the first direction, each of the first set of electrodes includes an L-shaped portion;
a second set of electrodes having a third electrode and a fourth electrode formed in a second metallization layer among the plurality of metallization layers, wherein the third electrode and the fourth electrode are separated by the insulation material, the third electrode includes third fingers extending in a second direction orthogonal to the first direction, and the fourth electrode includes fourth fingers extending in the second direction, each of the second set of electrodes includes an L-shaped portion; and
a plurality of L-shaped line plugs connecting the L-shaped portions of the second set of electrodes to the L-shaped portions of the first set of electrodes, wherein an entirety of an outer surface of each L-shaped line plug of the plurality of L-shaped line plugs is recessed with respect to an outer surface of the L-shaped portion of a corresponding electrode of the first set of electrodes.

2. The capacitor structure of claim 1, wherein the plurality of line plugs comprises
a first line plug that connects the first electrode to the third electrode, and
a second line plug that connects the second electrode to the fourth electrode.

3. The capacitor structure of claim 1, wherein the second set of electrodes extends above or below the first set of electrodes.

4. The capacitor structure of claim 2, wherein
the first electrode comprises a first bus having the first fingers,
the second electrode comprises a second bus having the second fingers,
the third electrode comprises a third bus having the third fingers,
the fourth electrode comprises a fourth bus having the fourth fingers, and
the first line plug connects the first bus to the third bus and the second line plug connects the second bus to the fourth bus.

5. The capacitor structure of claim 4, wherein the first fingers and the second fingers are placed in an alternating pattern and separated by the insulation material and the third fingers and the fourth fingers are placed in an alternating pattern and separated by the insulation material.

6. The capacitor structure of claim 1, wherein a thickness of the line plugs is about 50 nm to about 1000 nm.

7. The capacitor structure of claim 1, wherein a dielectric constant of the insulation material is less than about 3.0.

8. The capacitor structure of claim 1, wherein each line plug is made of a material selected from the group consisting of copper, copper alloy, aluminum, aluminum alloy, and combinations thereof.

9. A multi-layer capacitor, comprising:
a first set of electrodes having a first electrode and a second electrode, wherein the first electrode and the second electrode are in a first metallization layer, the first electrode and the second electrode are separated by an insulation material, and further wherein the first electrode comprises a first bus having first fingers extending in a first direction and the second electrode comprises a second bus having second fingers extending in the first direction, each of the first bus and the second bus includes an L-shaped portion;
a second set of electrodes having a third electrode and a fourth electrode, wherein the third electrode and the fourth electrode are in a second metallization layer, the third electrode and the fourth electrode are separated by the insulation material, and further wherein the third electrode comprises a third bus having third fingers extending in a second direction orthogonal to the first direction and the fourth electrode comprises a fourth bus having fourth fingers extending in the second direction, each of the third bus and the fourth bus includes an L-shaped portion;
a first L-shaped line plug connecting the L-shaped portion of the first bus to the L-shaped portion of the third bus, wherein an entire of an outer surface of the first L-shaped ling plug is recessed with respect to an outer surface of the L-shaped portion of the first bus and the L-shaped portion of the third bus; and
a second L-shaped line plug connecting the L-shaped portion of the second bus to the L-shaped portion of the fourth bus.

10. The multi-layer capacitor of claim 9, wherein the capacitor is a metal-oxide-metal capacitor.

11. The multi-layer capacitor of claim 9, wherein the capacitor is integrated into a memory logic device.

12. The multi-layer capacitor of claim 9, wherein the second set of electrodes extends above or below the first set of electrodes.

13. The multi-layer capacitor of claim 9, wherein each line plug is made of a material selected from the group consisting of copper, copper alloy, aluminum, aluminum alloy, and combinations thereof.

14. The multi-layer capacitor structure of claim 9, wherein a thickness of the line plugs is about 50 nm to about 1000 nm.

15. The multi-layer capacitor of claim 9, wherein
the first and third buses are L-shaped; and
the first line plug connecting the first bus to the third bus is also L-shaped.

16. The multi-layer capacitor of claim 15, wherein
the second and fourth buses are L-shaped; and
the second line plug connecting the second bus to the fourth bus is also L-shaped.

17. A capacitor structure, comprising:
a first set of electrodes having a first electrode including first fingers extending in a first direction and a second electrode including second fingers extending in the first direction formed in a first metallization layer among a plurality of metallization layers, wherein the first electrode and the second electrode are separated by an insulation material, each of the first set of electrodes includes an L-shaped portion;
a second set of electrodes having a third electrode including third fingers extending in a second direction different from the first direction and a fourth electrode including fourth fingers extending in the second direction formed in a second metallization layer among the plurality of metallization layers, wherein the third electrode and the fourth electrode are separated by the insulation material, wherein the second direction is orthogonal to the first direction, each of the second set of electrodes includes an L-shaped portion; and a plurality of L-shaped line plugs connecting the L-shaped portions of the second set of electrodes to the L-shaped portions of the first set of electrodes, wherein an entirety of an outer surface of each L-shaped line plug of the plurality of L-shaped line plugs is recessed with respect to an outer surface of the L-shaped portion of a corresponding electrode of the first set of electrodes.

18. The capacitor structure of claim 17, wherein the first fingers and second fingers are arranged in an interdigitating arrangement.

19. The capacitor structure of claim 17, wherein the first, second, third and fourth electrodes independently have a width ranging from 50 nanometers (nm) to 1000 nm.

20. The capacitor structure of claim 17, wherein the first and third electrodes comprise a different material than the second and fourth electrodes.

\* \* \* \* \*